United States Patent [19]

Sakakibara et al.

[11] Patent Number: 5,121,156
[45] Date of Patent: Jun. 9, 1992

[54] APPARATUS FOR DETECTING THE PROPER FUNCTIONING OF A THERMAL FIXING UNIT IN AN IMAGE FORMING APPARATUS

[75] Inventors: Kenji Sakakibara, Ichinomiya; Michitoshi Akao, Nagoya; Tokunori Katoh, Ichinomiya; Hiroshi Morisaki, Aichi; Takesi Izaki, Nagoya, all of Japan

[73] Assignee: Brother Kogyo Kabushiki Kaisha, Nagoya, Japan

[21] Appl. No.: 750,741

[22] Filed: Aug. 21, 1991

Related U.S. Application Data

[63] Continuation of Ser. No. 470,238, Jan. 25, 1990, abandoned.

[30] Foreign Application Priority Data

Jan. 30, 1989 [JP] Japan .................................. 1-20410

[51] Int. Cl.⁵ .............................................. G03B 27/32
[52] U.S. Cl. .......................................... 355/27; 355/30; 355/72

[58] Field of Search ................. 355/27, 28, 30, 72, 355/285; 219/216; 430/138

[56] References Cited

U.S. PATENT DOCUMENTS 4,893,147  1/1990  Tanabe et al. ...................... 355/27
4,914,479  4/1990  Ogura et al. ..................... 355/72 X Primary Examiner—L. T. Hix
Assistant Examiner—Khanh Dang
Attorney, Agent, or Firm—Oliff & Berridge

[57] ABSTRACT

An image forming apparatus has a thermal fixing unit which includes a heater to thermally fix an image on a recording medium. The temperature in the apparatus goes down when a replaceable unit is exchanged. A temperature sensor detects the reduction in temperature. A status sensor detects an exchanging state in which the replaceable unit is exchanged and outputs a detection signal indicating the exchanging state. A CPU judges that the heater is properly operating even if the temperature signal indicates the reduction in temperature when the detection signal is outputted.

20 Claims, 4 Drawing Sheets

APPARATUS FOR DETECTING THE PROPER FUNCTIONING OF A THERMAL FIXING UNIT IN AN IMAGE FORMING APPARATUS

This is a continuation of application Ser. No. 07/470,238 filed Jan. 25, 1990, now abandoned.

BACKGROUND OF THE INVENTION

1. Field of the Invention

The present invention relates to an image forming apparatus having a thermal fixing unit, and more particularly, to an image forming apparatus which detects the temperature of a thermal fixing unit to control the driving system of the image forming apparatus.

2. Description of Related Art

There are various types of image forming apparatus known which include thermal fixing units. As an example, a photosensitive pressure-sensitive copying machine as shown in FIG. 4 will be described. Since the controller of the copying machine illustrated in FIG. 4 has substantially the same structure, except for controller 31 and sensor 30, as the one disclosed in U.S. patent application Ser. No. 156,744 (filed Feb. 18, 1988), now U.S. Pat. No. 4,893,147, assigned to the same assignee of the present application, its detailed description will be omitted.

The photosensitive pressure-sensitive copying machine 1 uses a photosensitive sheet comprising a photosensitive pressure-sensitive sheet (microcapsule sheet) 11 and a developer sheet 16. Disposed at the top portion of the copying machine 1 are an original support stand glass 2 and a liftable stand cover 3. An original 4 is placed face down on the original support stand glass 2. Light emitted from a halogen lamp 5 is reflected by the original 4 and reaches an exposure stand 10 along the path indicated by the one-dot chain line in FIG. 4.

A detachable cartridge C contains an elongated microcapsule sheet 11. The sheet 11 fed out from the cartridge C travels under the exposure stand 10 and passes through a pressure developing unit 13 before being wound around a take-up shaft 15. The microcapsule sheet 11, when passing under the exposure stand 10, has a latent image formed thereon by the light reflected from the original 4.

A developer sheet 16 is pressed by the pressure developing unit 13 while it is associated with the portion of the microcapsule sheet 11 on which the latent image is formed. The pressure application ruptures light-unexposed or non-photocured microcapsules on sheet 11 and forms an image on the developer sheet 16. The developer sheet 16 is then delivered to a thermal fixing unit 20 where the image is thermally fixed by a heat roller 20a. Conventionally, an image forming apparatus with a thermal fixing unit, as shown in FIG. 4, detects the temperature of the thermal fixing unit to control the main driving system.

The following will describe a case where a prior art thermal fixing unit is applied to the copying machine shown in FIG. 4. A temperature sensor 30 will be provided near the thermal fixing unit 20 to detect the ambient temperature. An output signal from this sensor 30 is inputted to a controller 31. When the temperature sensor 30 detects that the temperature near the thermal fixing unit is low due to the heat roller 20a not being properly driven when the aforementioned main driving system is functioning, the controller 31 stops a main driving system to prevent a developer sheet from being discharged. This prevents a developer sheet from not being properly subjected to a thermal fixing process.

When the supply of microcapsule sheet 11 is exhausted, the cartridge C is removed from the copying machine 1 and is replaced with a new one. Since the thermal fixing unit 20 includes the heat roller 20a, the temperature of the old cartridge C is slightly increased. Immediately after a new cartridge C, which has been generally stored in a cool and dark place, is loaded, the temperature inside the image forming apparatus rapidly decreases. Accordingly, at the time the cartridge replacement takes place, the rapid decrease in temperature in the image forming apparatus causes the temperature sensor 30 to output a low temperature signal to the controller 31 even if the heat roller 20a has been activated and is functioning properly. Upon reception of this low temperature signal, the controller 31 stops the main driving system. This results in undesired interruption or stopping of various operations, such as auto sheet feeding from the new cartridge and the copying operation, which are executed under the normal conditions, until the temperature detected by sensor 30 increases to the desired level. Interruption of the auto sheet feed operation is inconvenient and causes unnecessary delays in the time required for replacing a used microcapsule cartridge with a fresh cartridge. After placing a fresh cartridge in the image forming machine, the leading end of the fresh role of recording medium must be fed through a series of rollers and wound around take-up shaft 15. If the controller is stopping the main driving system due to reception of the low temperature signal, the auto sheet feeding operation cannot begin. Since the low temperature signal will continue until the fresh cassette is heated, the time period required for replacing recording medium cartridges in the previously known image forming apparatus includes the time required for the fresh cassette to be adequately heated. The time required for the fresh cassette to be heated results in an undesirable delay in the exchange time.

SUMMARY OF THE INVENTION

Accordingly, it is an object of this invention to provide an image forming apparatus which prevents a main driving system from being stopped when a temperature sensor detects a reduction in ambient temperature at the time a replaceable unit such as a cartridge for a microcapsule sheet is replaced with a new cartridge, even when a heater of a thermal fixing unit is activated, thereby permitting execution of ordinary operations such as a sheet feeding operation and a copying operation, immediately upon replacement of the replaceable unit.

According to the present invention, there is provided an image forming apparatus having a thermal fixing unit including a heater to thermally fix an image on a recording medium comprising: a housing having a containing space for detachably containing a replaceable unit for an image forming operation; temperature detecting means for detecting a temperature around said thermal fixing unit and outputting a temperature signal; state detecting means for detecting an exchanging state in which said replaceable unit is being exchanged and outputting a detection signal; and control means for determining whether the heater is properly operating even if the temperature signal indicates a reduction in temperature when the detection signal is outputted.

BRIEF DESCRIPTION OF THE DRAWINGS

The above and other objects, features and advantages of the invention will become more apparent from reading the following description of a preferred embodiment taken in connection with the accompanying drawings in which.

DETAILED DESCRIPTION OF THE PREFERRED EMBODIMENT

Figure 3:
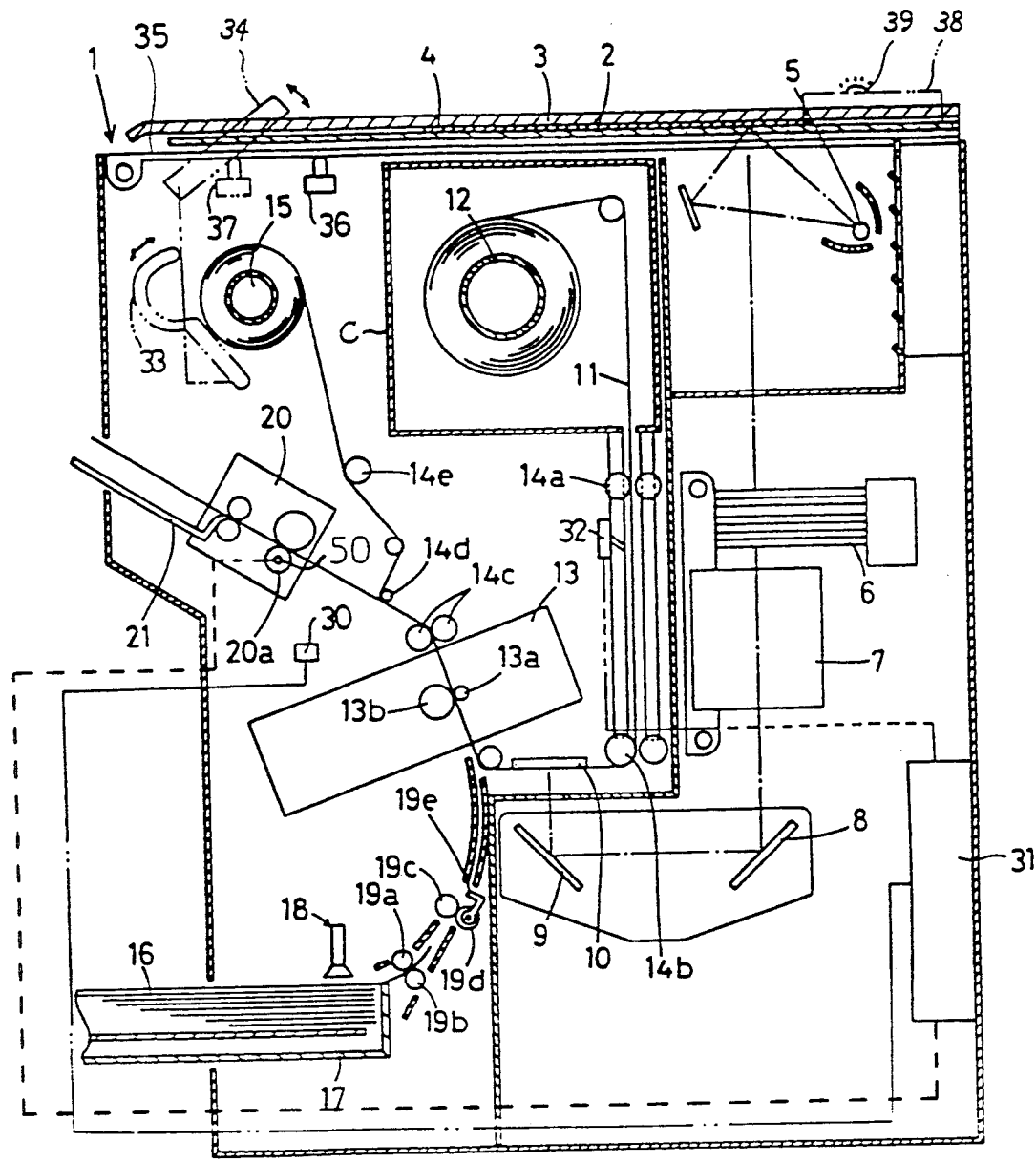
FIG. 3 is a diagram illustrating the arrangement of a copying machine embodying this invention.
Figure 4:
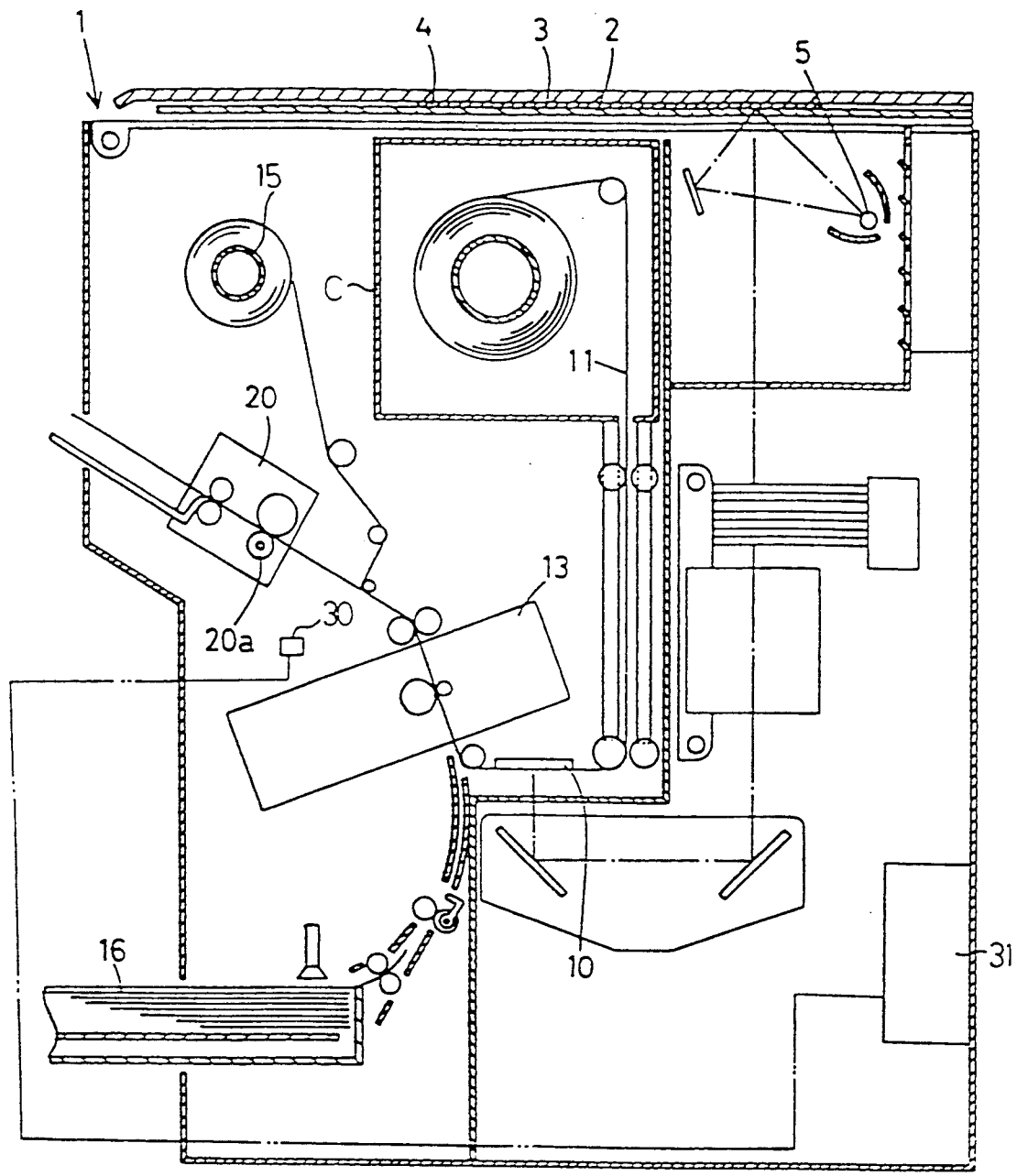
FIG. 4 is a diagram illustrating the arrangement of a copying machine realized by applying the prior art temperature detecting structure to a related copying machine.

As shown in FIG. 3, a photosensitive pressure-sensitive copying machine 1 uses a photosensitive pressure-sensitive sheet (microcapsule sheet) 11 and a developer sheet 16. A movable original support stand glass 2 and a stand cover 3 are provided at the top plate of the copying machine 1. An original 4 to be copied is placed face down on the original support stand glass 2.

At the top portion of the copying machine 1 is disposed a light source having a halogen lamp 5. The light source emits light beams to the original support stand glass 2 through slit holes formed in the top of the copying machine body. The light emitted from the halogen lamp 5 passes through the transparent original support stand glass 2 and is reflected by the original 4 placed on the glass 2. Therefore, as the original support stand glass 2 is moved, the reflection of the original 4 enters a projection lens 7 after passing through a filter 6 which serves to adjust the color tone of a copied image. The light from this lens 7 changes its traveling direction by a pair of reflection mirrors 8 and 9 and is focused on the elongated microcapsule sheet 11 located along an exposure stand 10. The reflection mirrors 8 and 9 are mounted on a mirror-mounting plate, and fine adjustment of the mounting position of this plate permits adjustment of the length of an optical path as well as focus adjustment.

The microcapsule sheet 11 is wound around a shaft 12 and is retained in a cartridge C which is detachable from the copying machine body. One end portion of the microcapsule sheet 11 extends to a take-up shaft 15, after passing through many rollers 14a, 14b and 14c, a pressure developing unit 13 and a separation mechanism 14d. More specifically, the microcapsule sheet 11 fed out from the lower portion of the cartridge C is led to the feed roller 14a and guide roller 14b, from which it is supplied to the pressure developing unit 13 after traveling under the exposure stand 10. After passing the pressure developing unit 13, the microcapsule sheet 11 is led to the feed roller 14c, the separation mechanism 14d and a meander travel control roller 14e, then is wound around the take-up shaft 15. The non light-exposed portion of the microcapusle sheet 11 fed out from the cartridge C has its unexposed state maintained by a light shielding cover. The traveling or feeding speed of the microcapsule sheet 11 is controlled to be constant and to be coincident with the moving speed of the original support stand glass 2, so that a latent image of a given line on the original 4 is sequentially formed on the microcapsule sheet 11 which is traveling under the exposure stand 10.

A sheet feeding cassette 17 retaining developer sheets, or recording sheets, 16 is mounted under the pressure developing unit 13. A sucker type sheet feeding mechanism 18 for sucking a sheet of paper by negative pressure attraction is also provided under the unit 13. This sheet feeding cassette 17 and the sheet feeding mechanism 18 constitute a sheet feeding unit. The developer sheets 16 are taken out one at a time by the sheet feeding mechanism 18 and fed out by a feed roller 19a and a pinch roller 19c. Each developer sheet 16 then has its leading edge portion aligned by developer sheet rollers 19c and 19d and a resist gate 19e before it is supplied to the pressure developing unit 13. Accordingly, the microcapsule sheet 11 and the developer sheet 16 are put closely together and are supplied to the pressure developing unit 13 where the microcapsule-bearing surface of the microcapsule sheet on which the latent image is formed, comes into contact with the developer-coated surface of the developer sheet 16. The microcapsule sheet 11 and the developer sheet 16 are held in this state and pressed together by a small-diameter roller (pressure roller) 13a and a backup roller 13b. This pressure ruptures non-photocured microcapsules to form an image on the developer sheet 16.

The microcapsule sheet 11 and developer sheet 16 coming out from the pressure developing unit 13 are separated by the separation mechanism 14d. The image on the separated developer sheet 16 is thermally fixed by a heat roller 20a of a thermal fixing unit 20 and then the developer sheet 16 is carried out on a discharge tray 21 by discharge rollers. The separated microcapsule sheet 11 is wound around the take-up shaft 15 through the meander travel control roller 14e.

A temperature sensor 30 is provided near the thermal fixing unit 20 for monitoring a temperature of the heat-fixing unit 20 and outputting a temperature detection signal to a controller 31. A sensor 32 is provided along a vertical sheet path and monitors whether the microcapsule sheet 11 is out of stock. Sensors 36 and 37 are provided below the inner cover 35 which is opened when the cartridge C is exchanged. The sensor 36 detects the opening and closing of the inner cover 35, and the sensor 37 detects the action of a sheet feeding lever 34. The sheet feeding lever 34 actuates a guide member 33 to be brought into engagement with the take-up shaft 15 to guide a leader provided at the leading end of the microcapsule sheet 11 along a gap between the take-up shaft 15 and the guide member 33 when the microcapsule sheet 11 is automatically fed to the take-up shaft 16 through a sheet feeding path defined by the sheet feeding means. The results detected by the sensors 36 and 37 are outputted as a cartridge exchange signal to the controller 31.

Figure 1:
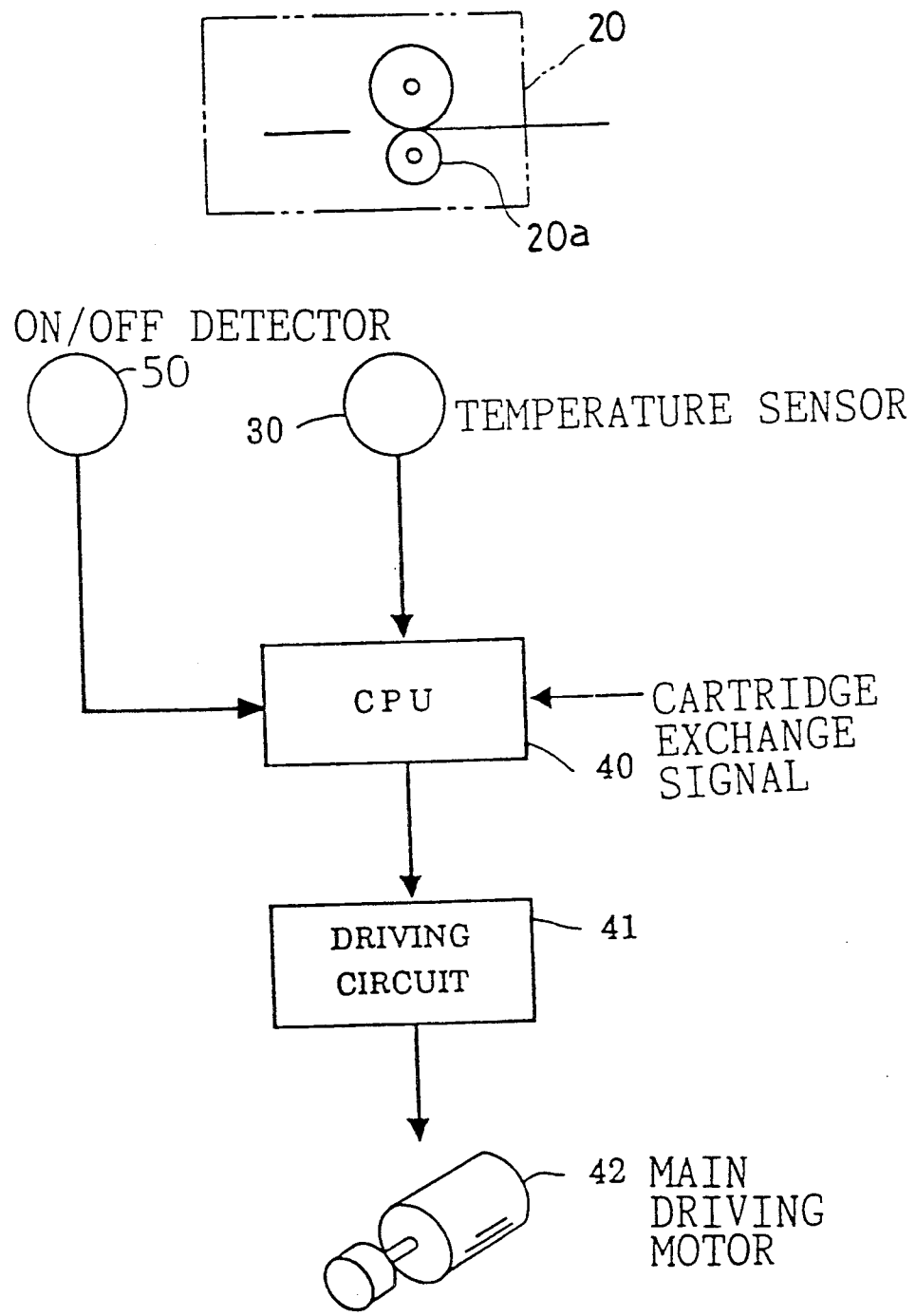
FIG. 1 is a block diagram schematically illustrating the operation of the present invention.

The operation of the image forming machine when used cartridge C is exchanged for a new one will now be described. FIG. 1 is a schematical view explaining a temperature detection operation in the copying machine as shown in FIG. 3.

When a heat roller 20a of the thermal fixing unit 20 is not switched to an ON-state and thus the heat-fixing unit 20 is not being normally operated, the temperature sensor 30 outputs to the CPU 40 (provided in the controller 31) a low-temperature signal representing that the temperature of the heat roller 20a is low. In response to the low-temperature signal from the temperature sensor 30, the CPU 40 supplies a stop signal to a driving circuit 41 in a main driving system including a main driving motor 42 for performing a copying operation of the copying machine to thereby stop the driving of the main driving motor 42.

Immediately after the cartridge C is exchanged for a new cartridge, the sensor 30 erroneously outputs a low-temperature signal irrespective of the heat roller 20a being in the ON-state because the new cartridge C is kept in an atmosphere of low temperature before exchange. However, in the present invention, the CPU 40 neglects the low-temperature signal outputted erroneously by the sensor 30 and controls the driving circuit 41 to continue the rotation of the main driving motor 42 even though the low-temperature signal is being applied to the CPU 40.

Figure 2:
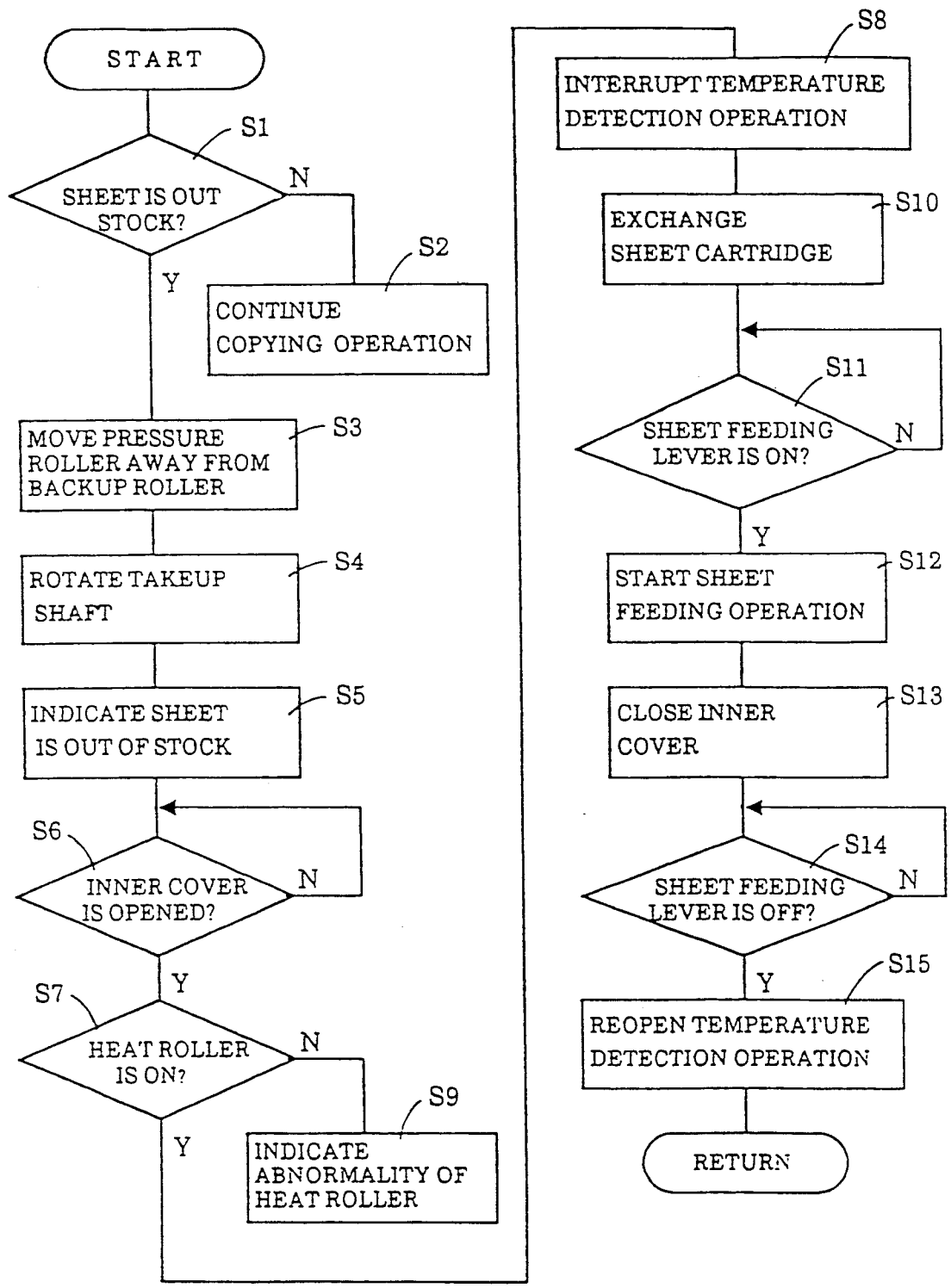
FIG. 2 is an operational flowchart of the present invention.

FIG. 2 is a flow chart for the operation of exchanging a used cartridge for a new one and the feeding operation of the leader and the photosensitive recording sheet as described above. In step 1(S1), on the basis of a monitoring signal outputted from the sensor 32, the CPU 40 determines whether the microcapsule sheet 11 is out of stock in the cartridge C. If it is determined that the microcapsule sheet 11 is not out of stock, the copying operation is continued in step 2(S2). On the other hand, if it is determined that the microcapsule sheet 11 is out of stock, the pressure roller 13a of the pressure developing unit 13 is moved away from the backup roller 13b in step 3(S3). Thereafter, the take-up shaft 15 is rotated in step 4(S4) to wind up a tail portion of the microcapsule sheet 11 in the cartridge C and the lamp 39 in the display unit 38 lights up for indicating that the microcapsule sheet 11 is out of stock in step 5(S5).

Further, in a step 6(S6), on the basis of the cartridge exchange signal outputted from the sensor 36, the CPU 40 determines whether the inner cover 35 is opened. If it is determined that the inner cover 35 is opened, it is subsequently determined whether the heat roller 20a is in the ON-state in step 7 S7) ON/OFF detector 50 provides CPU 40 with the information regarding whether heat roller 20a is turned ON. If it is determined that the heat roller 20a is in the ON-state, the input of the low-temperature signal from the sensor 30 to the CPU 40 is interrupted, so that the decrease of the temperature of the heat roller 20a is neglected in step 8(S8). On the other hand, if it is determined that the heat roller 20a is not in the ON-state, abnormality of the heat roller 20a is indicated in step 9(S9). Next, a used cartridge C is exchanged for a new one in a step 10(S10). In this case, a circumference of the cartridge C is temporarily cooled by the new cartridge C because the new cartridge C has been kept in an atmosphere of low temperature. Thereafter, if on the basis of the cartridge exchange signal of the sensor 37 it is determined that the automatically sheet-feeding lever 34 is in a ON-state in step 11(S11), an automatic feeding operation starts in step 12(S12). After the feeding operation is completed, any display for indicating the completion of the automatic feeding operation is made, the inner cover 35 is closed in step 13 (S13) and the automatically sheet-feeding lever 34 is switched to an OFF-state in step 14 (S14). After the above processes are carried out, the temperature inside of the copying machine increases around the heat roller 21a and therefore the temperature detection operation of the sensor 30 is commenced in response to the cartridge exchange signal of the sensor 37 which indicates the OFF-state of the automatically sheet-feeding lever 34 in a step 15 (S15), and the apparatus returns to the ordinary copying operation.

While the present invention has been described in its preferred embodiment, it is to be understood that the invention is not confined to the specific embodiment disclosed herein. Various changes, modifications and improvements may be made in the invention which do not affect the spirit of the invention nor exceed the scope thereof as expressed in the appended claims.

What is claimed is:

1. An image forming apparatus having a thermal fixing unit including a heater to thermally fix an image on a recording medium comprising:

a housing having a containing space for detachably containing a replaceable unit for an image forming operation therein;

temperature detecting means for detecting a temperature in said housing around said thermal fixing unit and outputting a temperature signal;

state detecting means for detecting an exchanging state in which said replaceable unit is being exchanged and outputting a detection signal; and control means for determining whether the heater is operating at an appropriate temperature based on said temperature signal when said detection signal does not indicate an exchanging state, and for determining whether said heater is turned on when the detection signal indicates an exchanging state, said control means neglecting said temperature signal when said detection signal indicates an exchanging state.

2. An image forming apparatus as claimed in claim 1, wherein said replaceable unit includes a cartridge including a consumable material therein.

3. An image forming apparatus as claimed in claim 2 further comprising a covering member provided on said housing for opening and closing to provide access to said containing space, and wherein said state detecting means includes a switch operated by movement of said covering member.

4. An image forming apparatus as claimed in claim 2, wherein said recording medium consists of a developer sheet, and wherein said consumable material consists of a photosensitive pressure-sensitive sheet reactable with said developer sheet.

5. The image forming apparatus as claimed in claim 2, wherein said consumable material is a photosensitive pressure-sensitive sheet, and wherein said control means also controls an auto sheet feeding operation wherein said image recording medium is fed into an operative position within said image forming apparatus, and wherein said control means stops said auto sheet feeding operation when it determines that the heater is not operating at the appropriate temperature and that the heater is not turned on when the detection signal is output.

6. An image forming apparatus as claimed in claim 1, wherein said control means stops neglecting said temperature signal after a period from a starting time of the neglection.

7. An image forming apparatus as claimed in claim 6, further comprising indicating means for indicating a completion of the exchanging state and outputting a completion signal, and wherein said period ends upon the outputting of said completion signal.

8. An image forming apparatus for forming an image on a recording medium comprising:

a housing;

a thermal fixing unit located in said housing and including a heater for thermally fixing an image on a recording medium;

containing means in said housing for detachably containing a replaceable unit used during an image forming operation;

temperature detecting means for detecting the temperature in said housing around said thermal fixing unit and outputting a temperature signal;

state detecting means for detecting an exchanging state in which said replaceable unit is being exchanged and for outputting a detection signal; and control means for determining whether the heater is operating properly based upon the detection signal and the temperature signal, wherein said control means determines that the heater is operating properly when the temperature signal indicates a reduction in temperature when the detection signal indicates that an exchanging state exists by determining whether the heater is turned on.

9. The apparatus of claim 8, wherein said control means neglects the temperature signal when the detection signal indicates that the replaceable unit is being replaced.

10. The apparatus of claim 9, wherein said control means also determines whether the heater is functioning while neglecting said temperature signal by determining whether said heater is turned on.

11. The apparatus of claim 8, wherein said control means neglects the temperature signal for a time period after the state detecting means indicates that the replaceable unit is in said exchange state.

12. The apparatus of claim 11, further comprising indicating means for indicating the completion of the exchange state and outputting an indicating signal, and wherein said time period ends upon the output of said indicating signal.

13. The apparatus of claim 8, wherein said replaceable unit is a cartridge including a consumable material therein.

14. The image forming apparatus as claimed in claim 13, wherein said consumable material is a photosensitive pressure-sensitive sheet, and wherein said control means also controls an auto sheet feeding operation wherein said photosensitive pressure-sensitive sheet is fed into an operation position within said image forming apparatus, and wherein said control means stops said auto sheet feeding operation when it determines that the heater is not properly operating.

15. An image forming apparatus for forming an image on a recording medium comprising:

a housing;

a thermal fixing unit located in said housing, said thermal fixing unit including a heater for thermally fixing an image on a recording medium;

containing means in said housing for detachably containing a replaceable unit used during an image forming operation;

temperature detecting means for detecting the temperature in said housing around said thermal fixing unit and outputting a temperature signal;

state detecting means for detecting an exchanging state in which said replaceable unit is being exchanged and for outputting a detection signal;

indicating means for indicating a completion of the exchange state and outputting a completion signal; and control means for determining whether the heater is operating, said control means having a first mode of operation wherein said temperature signal is used to determine whether the heater is operating and a second mode of operation when the detection signal indicates an exchanging state, wherein said temperature signal is neglected and a determination is made whether said heater is turned on when determining whether the heater is operating, said neglection lasting until said completion signal is outputted.

16. An image forming apparatus comprising:

a housing;

a thermal fixing unit located in said housing and including a heater for thermally fixing an image on a recording medium;

containing means in said housing for detachably containing a replaceable unit used during an image forming operation;

temperature detecting means for detecting the temperature in said housing around said thermal fixing unit and outputting a temperature signal;

state detecting means for detecting an exchanging state in which said replaceable unit is being exchanged and for outputting a detection signal; and control means for determining whether the heater is operating properly based upon the detection signal and the temperature signal, said control means controlling an auto sheet feeding operation wherein sheet material is fed from said replaceable unit, said control means stopping said auto sheet feeding operation when it determines that said heater is not operating properly, wherein said control means neglects said temperature signal when the detection signal indicates that the replaceable unit is being replaced and determines whether said heater is functioning while reglecting said temperature signal by determining whether said heater is turned on.

17. The apparatus of claim 16, wherein said control means neglects the temperature signal for a time period after the state detecting means indicates that the replaceable unit is in said exchange state.

18. The apparatus of claim 17, further comprising indicating means for indicating the completion of the exchange state and outputting an indicating signal, and wherein said time period ends upon the output of said indicating signal.

19. The apparatus of claim 16 wherein said replaceable unit is a cartridge including a consumable material therein.

20. An image forming apparatus as claimed in claim 19, wherein said consumable material consists of a photosensitive pressure-sensitive sheet.

* * * * *